United States Patent
Polak et al.

(10) Patent No.: US 10,895,622 B2
(45) Date of Patent: Jan. 19, 2021

(54) NOISE SUPPRESSION FOR WAVE-CAIPI

(71) Applicants: Siemens Healthcare GmbH, Erlangen (DE); The General Hospital Corporation, Boston, MA (US)

(72) Inventors: Daniel Polak, Blankenbach (DE); Esther Raithel, Dormitz (DE); Kawin Setsompop, Boston, MA (US)

(73) Assignees: Siemens Healthcare GmbH, Erlangen (DE); The General Hospital Corporation, Boston, MA (US)

( * ) Notice: Subject to any disclaimer, the term of this patent is extended or adjusted under 35 U.S.C. 154(b) by 0 days.

(21) Appl. No.: 16/289,985

(22) Filed: Mar. 1, 2019

(65) Prior Publication Data

US 2019/0285713 A1    Sep. 19, 2019

Related U.S. Application Data

(60) Provisional application No. 62/642,143, filed on Mar. 13, 2018.

(51) Int. Cl.
*G01R 33/56* (2006.01)
*G06N 20/00* (2019.01)
*G06N 3/08* (2006.01)
*G01R 33/561* (2006.01)

(52) U.S. Cl.
CPC ...... *G01R 33/5608* (2013.01); *G01R 33/5611* (2013.01); *G06N 3/08* (2013.01); *G06N 20/00* (2019.01)

(58) Field of Classification Search
CPC .......... G01R 33/5608; G01R 33/5611; G06N 20/00; G06N 3/08
See application file for complete search history.

(56) References Cited

U.S. PATENT DOCUMENTS

| | | | |
|---|---|---|---|
| 2016/0154079 A1* | 6/2016 | Jellus ................ | G01R 33/5611 324/309 |
| 2018/0164395 A1 | 6/2018 | Setsompop et al. | |
| 2019/0257905 A1* | 8/2019 | Cheng ............... | G01R 33/5608 |

OTHER PUBLICATIONS

Breuer, Felix A. et al. "Controlled Aliasing in Volumetric Parallel Imaging (2D CAIPIRINHA)" Magnetic Resonance in Medicine, vol. 55, pp. 549-556, 2006 // DOI: DOI 10.1002/mrm.20787.
Zhang, Xinyuan et al.: "Denoising MR Images Using Non-Local Means Filter with Combined Patch and Pixel Similarity"; in: PLoS One; vol. 9 No. 6; 2014; doi:10.1371/journal.pone.0100240.
Kannengiesser, Stephan et al.: "Universal iterative denoising of complex-valued volumetric MR image data using supplementary information"; ISMRM Abstract #1779; 2016.
Bilgic, Berkin et al. "Wave-CAIPI for Highly Accelerated 3D Imaging" Magnetic Resonance in Medicine, vol. 73, No. 6, pp. 2152-2162, 2015 // DOI: 10.1002/mrm.25347.

(Continued)

*Primary Examiner* — Gregory H Curran
(74) *Attorney, Agent, or Firm* — Schiff Hardin LLP

(57) ABSTRACT

Techniques are disclosed to leverage the use of neural networks or similar machine learning algorithms to de-noise highly accelerated Wave-CAIPIRINHA scans. The described techniques facilitate the generation of 3D sequences using a greatly reduced scan time, with the resulting images having a high spatial resolution and an improved SNR compared to conventional approaches.

23 Claims, 8 Drawing Sheets

(56) References Cited

OTHER PUBLICATIONS

Gong, Enhao et al.: "Improving the PI+CS Reconstruction for Highly Undersampled Multi-contrast MRI using Local Deep Network"; ISMRM abstract #5663, 2017.
Lustig, Michael et al.: "Sparse MRI: The Application of Compressed Sensing for Rapid MR Imaging"; in: Magnetic Resonance in Medicine; vol. 58, No. 6; pp. 1182-1195; 2007; XP007907974; ISSN: 0740-3194; DOI: 10.1002/MRM.21391; 2007.
Parallel Imaging Reconstruction Using Automatic Regularization; Fa-Hsuan Lin, et al., Magnetic Resonance in Medicine 51:559-567 (2004).
C. Tomasi, R. Maduchi,; Bilateral Filtering for Gray and Color Images ICCV '98: Proceedings of the Sixth International Conference on Computer Vision, Washington, DC, United States, 1998, pp. 839-846; 1998.
Cauley, Stephen F. et al.: "Autocalibrated Wave-CAIPI Reconstruction; Joint Optimization of k-Space Trajectory and Parallel Imaging Reconstruction"; in: Magnetic Resonance in Medicine; pp. 1-7; 2016.
Cicek, Özgün et al.: "3D U-Net: Learning Dense Volumetric Segmentation from Sparse Annotation"; 2016; arXiv:1606.06650; 2016.
Ronneberger, Olaf et al. "U-Net: Convolutional Networks for Biomedical Image Segmentation" Medical Image Computing and Computer-Assisted Intervention (MICCAI), Springer, LNCS, vol. 9351, pp. 234-241, 2015 // arXiv:1505.04597 [cs.CV].
Zhu, Bo et al.: "Image reconstruction by domain transform manifold learning"; 2017; arXiv:1704.08841.
Hammernik, Kerstin et al.: "Learning a Variational Network for Reconstruction of Accelerated MRI Data"; in: Magnetic Resonance in Medicine; vol. 79; pp. 3055-3071; 2018; DOI 10.1002/mrm.26977.
Polak, Daniel et al.: "Highly-accelerated brain MRI protocol using optimized Wave-CAIPI encoding"; accepted ISMRM abstract, 2018.
Polak, Daniel et al. "Wave-CAIPI for Highly Accelerated MP-RAGE Imaging" Magnetic Resonance in Medicine, vol. 79, No. 1, pp. 401-406, Jan. 2018 (First published: Feb. 20, 2017) // DOI: 10.1002/mrm.26649.

* cited by examiner

NOISE SUPPRESSION FOR WAVE-CAIPI

CROSS-REFERENCE TO RELATED APPLICATIONS

The present application claims the benefit of the filing date of provisional application 62/642,143, filed on Mar. 13, 2018, the contents of which are incorporated herein by reference in their entirety.

TECHNICAL FIELD

The present invention concerns methods and devices for magnetic resonance imaging (MRI), and in particular to such methods and devices that to de-noise highly accelerated Wave-CAIPIRINHA (controlled aliasing in volumetric parallel imaging) scans.

BACKGROUND

Three-dimensional (3D) sequences allow isotropic resolution at high signal-to-noise ratio (SNR). However, in comparison to 2D sequences, several downsides arise that limit the acceptance and wide application as part of a clinical routine. For instance, the large number of phase and partition encoding steps necessary for spatial encoding result in long scan times.

As an example, a conventional full head magnetization-prepared rapid acquisition with gradient echo (MPRAGE) protocol using 1mm isotropic resolution, a matrix size of 256×256×192, R=2×1 Generalized autocalibrating partially parallel acquisitions (GRAPPA), TR=2.5 s, and a turbo factor of 192, requires approximately 5 minutes of scan time. As another example, a Sampling Perfection with Application optimized Contrasts using different flip angle Evolution (SPACE) Fluid-attenuated inversion recovery (FLAIR) protocol using a TR=5 s, a turbo factor of 280, R=2×2 GRAPPA, and an 86% partial echo (PE)-Partial Fourier requires approximately 6 minutes of scan time. As a result, current 3D sequence processing limits the patient throughput and increases the susceptibility of patient motion.

SUMMARY OF THE INVENTION

Conventional parallel imaging methods (e.g., 2D-CAIPIRINHA [1], compressed sensing [2], Wave-CAIPIRINHA [3], etc.) may be utilized to reduce scan time without a loss of resolution. However, the application of these techniques generally yields a signal-to-loss ratio (SNR) loss that is proportional to the so-called "g-factor" (a measure given by the parallel imaging algorithm and the coil geometry), as well as the square root of the acceleration factor sqrt(R). Wave-CAIPIRINHA allows for highly-accelerated reconstructions with close to optimal g-factor performance (~1), which was been demonstrated for various 3D sequences (e.g., MPRAGE [4], SPACE T2w [5], SPACE FLAIR [5], susceptibility-weighted imaging (SWI) [3], etc.). Nevertheless, these conventional accelerated Wave-CAIPI (controlled aliasing in parallel imaging) scans have an intrinsic sqrt(R) SNR loss that may lead to noisy reconstructions.

To remedy these issues, the aspects described herein relate to techniques to de-noise highly accelerated Wave-CAIPIRINHA scans, which may be performed using a neural network, for example. The application of these techniques described herein allows for the generation of 3D sequences using a greatly reduced scan time, with the resulting images having a high spatial resolution and an improved SNR (compared to conventional approaches).

The aspects described herein may be particularly suitable, for example, to improve upon fast neuro-protocols using optimized Wave-CAIPI encoding [5]. As an example, these neuro-protocols may include and/or be implemented as part of an application in, for example, Wave MPRAGE, SPACE T2w, SPACE FLAIR, and SWI at 1 mm isotropic resolution. The aspects described herein utilize a combination of fast Wave scans and de-noising to help increase patient throughput, reduce the risk of patient motion, and improve the overall image quality.

Moreover, the aspects described herein are also relevant for low-end systems (e.g., low field MRI scanners), as the aspects provide lower intrinsic SNR than high-field scanners. On such low-end systems, even moderate acceleration factors (R=3×2) may result in noisy images, which can be mitigated using the techniques described throughout this disclosure. As an added advantage, fewer computational resources are required as compared to Compressed Sensing and other iterative reconstruction techniques, enabling short reconstruction times even on low-end hardware.

BRIEF DESCRIPTION OF THE DRAWINGS/FIGURES

The accompanying drawings, which are incorporated herein and form a part of the specification, illustrate the aspects of the present disclosure and, together with the description, further serve to explain the principles of the aspects and to enable a person skilled in the pertinent art to make and use the aspects.

The exemplary aspects of the present disclosure will be described with reference to the accompanying drawings. The drawing in which an element first appears is typically indicated by the leftmost digit(s) in the corresponding reference number.

DETAILED DESCRIPTION

Figure 1:
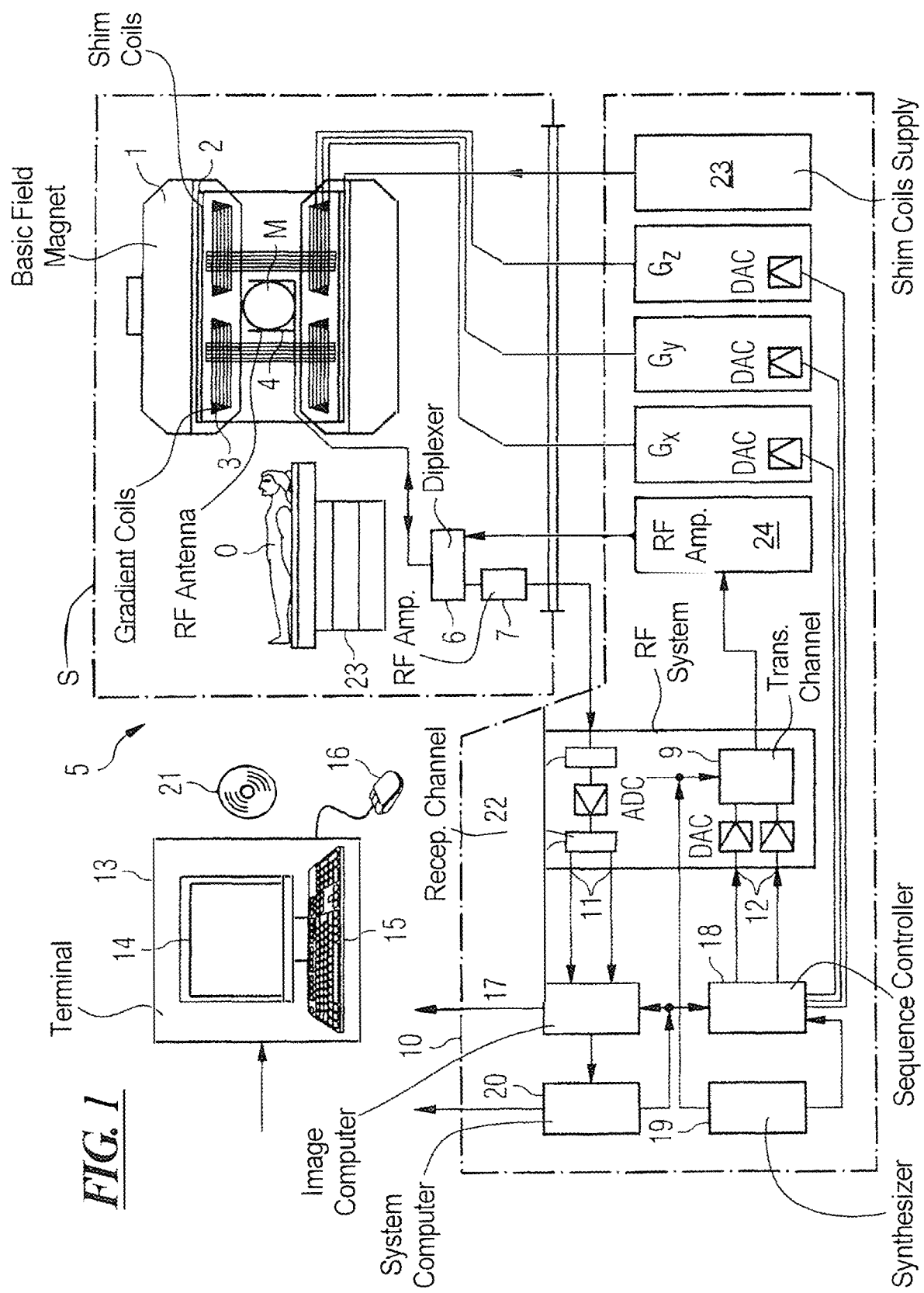
FIG. 1 is a block diagram of a magnetic resonance apparatus constructed and operating in accordance with the present aspects.

FIG. 1 schematically illustrates a magnetic resonance apparatus 5 (a magnetic resonance imaging or tomography device). A basic field magnet 1 generates, a temporally constant strong magnetic field for the polarization or alignment of the nuclear spin in a region of an examination subject O, such as a portion of a human body that is to be examined, lying on a table 23 in order to be moved into the magnetic resonance apparatus 5. The high degree of homogeneity in the basic magnetic field necessary for the magnetic resonance measurement (data acquisition) is defined in a typically sphere-shaped measurement volume M, in which the portion of the human body that is to be examined is placed. In order to support the homogeneity requirements temporally constant effects are eliminated by shim-plates made of ferromagnetic materials are placed at appropriate positions. Temporally variable effects are eliminated by shim-coils 2 and an appropriate control unit 23 for the shim-coils 2.

A cylindrically shaped gradient coil or gradient field system 3 is incorporated in the basic field magnet 1, composed of three windings. Each winding is supplied by a corresponding amplifier Gx, Gy and Gz, with power for generating a linear gradient field in a respective axis of a Cartesian coordinate system. The first partial winding of the gradient field system 3 generates a gradient Gx in the x-axis, the second partial winding generates a gradient Gy in the y-axis, and the third partial winding generates a gradient Gz in the z-axis. Each amplifier 24-26 has a digital-analog converter (DAC), controlled by a sequencer 18 for the accurately-times generation of gradient pulses.

A radio-frequency antenna 4 is located within the gradient field system 3, which converts the radio-frequency pulses provided by a radio-frequency power amplifier 24 into a magnetic alternating field for the excitation of the nuclei by tipping ("flipping") the spins in the subject or the region thereof to be examined, from the alignment produced by the basic magnetic field. The radio-frequency antenna 4 is composed of one or more RF transmitting coils and one or more RF receiving coils in the form of an annular, linear or matrix type configuration of coils. The alternating field based on the precessing nuclear spin, i.e. the nuclear spin echo signal normally produced from a pulse sequence composed of one or more radio-frequency pulses and one or more gradient pulses, is also converted by the RF receiving coils of the radio-frequency antenna 4 into a voltage (measurement signal), which is transmitted to a radio-frequency system 22 via an amplifier 7 of a radio-frequency receiver channel 8, 8'.

The radio-frequency system 22 furthermore has a transmitting channel 9, in which the radio-frequency pulses for the excitation of the magnetic nuclear resonance are generated. For this purpose, the respective radio-frequency pulses are digitally depicted in the sequencer 18 as a series of complex numbers, based on a given pulse sequence provided by the system computer 20. This number series is sent via an input 12, in each case, as real and imaginary number components to a digital-analog converter (DAC) in the radio-frequency system 22 and from there to the transmitting channel 9. The pulse sequences are modulated in the transmitting channel 9 to a radio-frequency carrier signal, the base frequency of which corresponds to the resonance frequency of the nuclear spin in the measurement volume. The modulated pulse sequences of the RF transmitter coil are transmitted to the radio-frequency antenna 4 via an amplifier 28.

Switching from transmitting to receiving operation occurs via a transmission-receiving switch 6. The RF transmitting coil of the radio-frequency antenna 4 radiates the radio-frequency pulse for the excitation of the nuclear spin in the measurement volume M and scans the resulting echo signals via the RF receiving coils. The corresponding magnetic resonance signals obtained thereby are demodulated to an intermediate frequency in a phase sensitive manner in a first demodulator 8' of the receiving channel of the radio-frequency system 22, and digitalized in an analog-digital converter (ADC). This signal is then demodulated to the base frequency.

The demodulation to the base frequency and the separation into real and imaginary parts occurs after digitization in the spatial domain in a second demodulator 8, which emits the demodulated data via outputs 11 to an image processor 17. In an image processor 17, an MR image is reconstructed from the measurement data obtained in this manner, which includes computation of at least one disturbance matrix and the inversion thereof, in the image processor 17. The management of the measurement data, the image data, and the control program occurs via the system computer 20. The sequencer 18 controls the generation of the desired pulse sequences and the corresponding scanning of k-space with control programs. The sequencer 18 controls accurately-timed switching (activation) of the gradients, the transmission of the radio-frequency pulse with a defined phase amplitude, and the reception of the magnetic resonance signals. The time base for the radio-frequency system 22 and the sequencer 18 is provided by a synthesizer 19.

The selection of appropriate control programs for the generation of an MR image, which are stored, for example, on a DVD 21, as well as other user inputs such as a desired number n of adjacent clusters, which are to collectively cover the desired k-space, and the display of the generated MR images, occurs via a terminal 13, which includes units for enabling input entries, such as, e.g. a keyboard 15, and/or a mouse 16, and a unit for enabling a display, such as, e.g. a display screen. The components within the dot-dash outline S are commonly called a magnetic resonance scanner.

Thus, the magnetic resonance apparatus 5 as shown in FIG. 1 may include various components to facilitate the measurement, collection, and storage of MRI data. As discussed in further detail herein, the MRI data may include under-sampled datasets obtained in accordance with accelerated MR scanning. The under-sampled datasets may then be reconstructed and de-noised through the use of appropriately trained convolutional neural networks or similar machine learning algorithms to produce images having an improved quality and in less time than conventional de-noising techniques. With regards to conventional de-noising techniques, these generally fall within four categories: Thikinov regularization, compressed sensing, conventional post-processing filtering, and Deep Learning based image reconstructions and de-noising methods.

Thikinov regularization uses several parallel imaging techniques (e.g., SENSE) to solve ill-conditioned linear systems at high acceleration factors [6]. To stabilize the solution, often the Tikhonov regularization is used, which minimizes the cost function as shown below in Equation 1.

$$\mathrm{argmin}\|Ax-y\|_2 + \lambda\|L(x-x_0)\|_2 \qquad \mathrm{Eqn.\ 1}$$

With reference to Eqn. 1, A denotes the encoding matrix, x the final image, $x_0$ a "prior knowledge" (e.g., auto-calibration signals (ACS) or low resolution scan), y the under-sampled raw data, and L a linear transformation. The regularization parameter $\lambda$ determines the trade-off between noise amplification from solving an ill-conditioned linear system and errors from $x_0$ not adequately describing the true image x. Such techniques have drawbacks, however, in that routine, reliable predictions of $\lambda$ are hard to calculate, and thus individual adaption for each application is necessary.

MR scans tend to be sparse when transformed to a suitable domain (e.g., Wavelet transformation) [2]. This prior knowledge improves reconstructions from highly under-sampled scans, but comes at the cost of increased reconstruction times. Also, static scans can often be sparsified only to a certain degree, thus limiting the possible acceleration. Furthermore, the quality of the images strongly depends on the choice of regularization parameters, which poses a challenge for clinical translation. Additionally, compressed sensing bears the risk of over-smoothing, as handcrafted transformations (such as Wavelet) often do not capture the whole complexity of anatomical scans.

Conventional post-processing filters (e.g., nonlocal means filters [7], bilateral filters [8], WAVELET de-noizers such as parameter free iterative de-noizing [9], etc.) may be applied to input images. For instance, post-processing filters may be implemented after a parallel imaging reconstruction is performed (e.g. SENSE, GRAPPA, etc.) to de-noise the generated images. However, these filters cannot remove residual aliasing artifacts, and are often prone to over-smoothing, especially for inhomogeneous noise distributions. Furthermore, de-noising algorithms provide better performance than pure post-processing filters when taking advantage of the MR raw data.

Neural networks offer an alternative to conventional methods of parallel imaging. In general, neural networks are combined to form a complex network. In a precedent training process, the filtering weights are jointly optimized for the desired task of image reconstruction or de-noising. This process requires at least one under-sampled and one ground truth (i.e., fully-sampled) dataset, which can be time-consuming. After the training, an accelerated scan is propagated through the network, which is considerably faster than iterative compressed sensing reconstructions and often provides a more natural image appearance.

Several deep learning algorithms have been published for the task of image reconstruction and de-noising. In addition to the employed network architecture, the choice of input data may vary. For instance, some neural network techniques (e.g., those described in references [10] and [11]) directly feed the under-sampled scanner data to the network. In contrast, other neural network techniques (e.g., those described in [12]) utilize a compressed sensing reconstruction, which serves as initial input to the deep learning network. This approach further allows simultaneous training of multiple contrasts, which improves the quality of the reconstructed scans.

Figure 2:
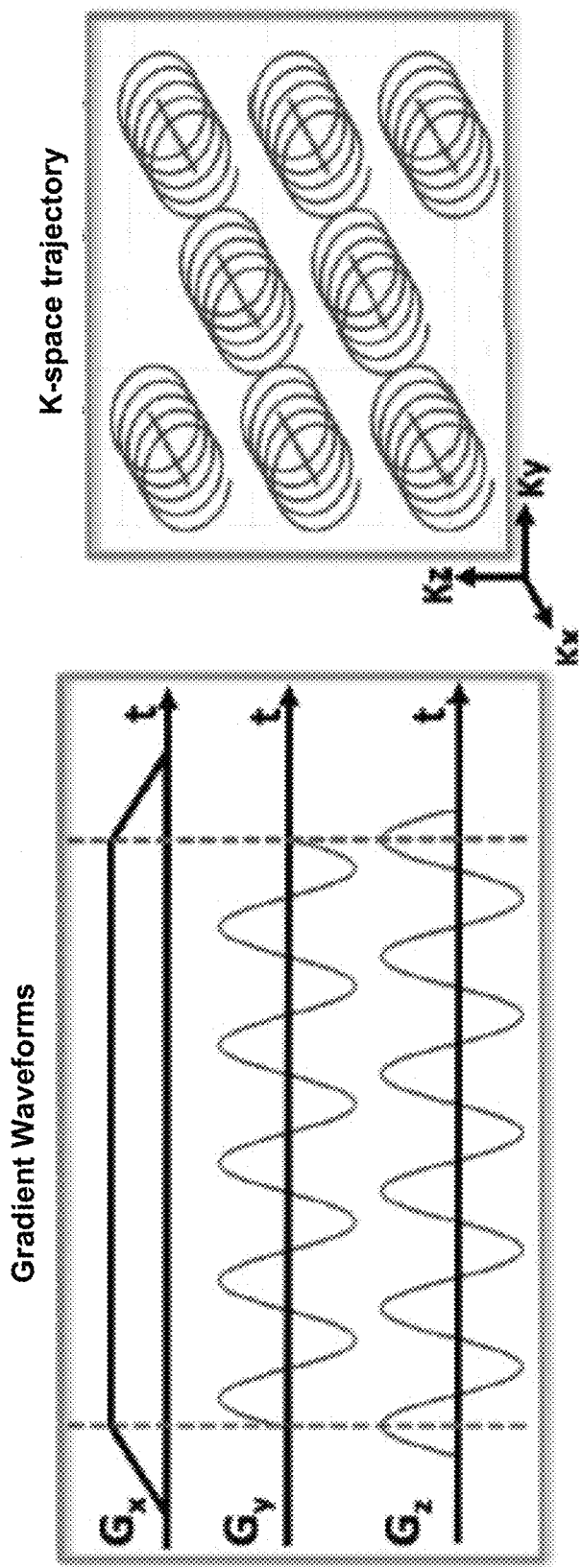
FIG. 2 is a graphical illustration of oscillating wave gradients played during the analog-to-digital conversion (ADC), in accordance with an aspect of the disclosure.

FIG. 2 is a graphical illustration of oscillating wave gradients played during the analog-to-digital conversion (ADC). As shown in FIG. 2, the oscillating wave gradients correspond to a corkscrew trajectory in k-space. The wave gradients may correspond, for instance, to the wave gradients generated by the gradient field system 3, as discussed herein with reference to FIG. 1. With further reference to FIG. 2, the aspects described herein advantageously combine Wave-CAIPIRINHA with post-processing and neural network techniques to form a hybrid approach that suppresses noise. An example of the use of wave-CAIPI implementation described herein is shown in FIG. 2, in which two gradient trajectories (e.g., sinusoidal) are added during readout, which are played along the phase (PE) and partition encoding (PAR) direction (FIG. 1).

This spreads the image along the readout direction, depending on the distance to the isocenter. If the k-space is also under-sampled along the two phase encoding directions (PE/PAR), aliasing artifacts appear along all three dimensions, which allows Wave-CAIPI to take full advantage of the 3D coil sensitivity profiles. This provides improved reconstruction quality at high acceleration factors. In contrast, conventional methods (e.g., 2D-CAIPIRINHA), distribute aliasing artifacts only along the PE and PAR direction, which may introduce increased noise amplification.

Figure 3:
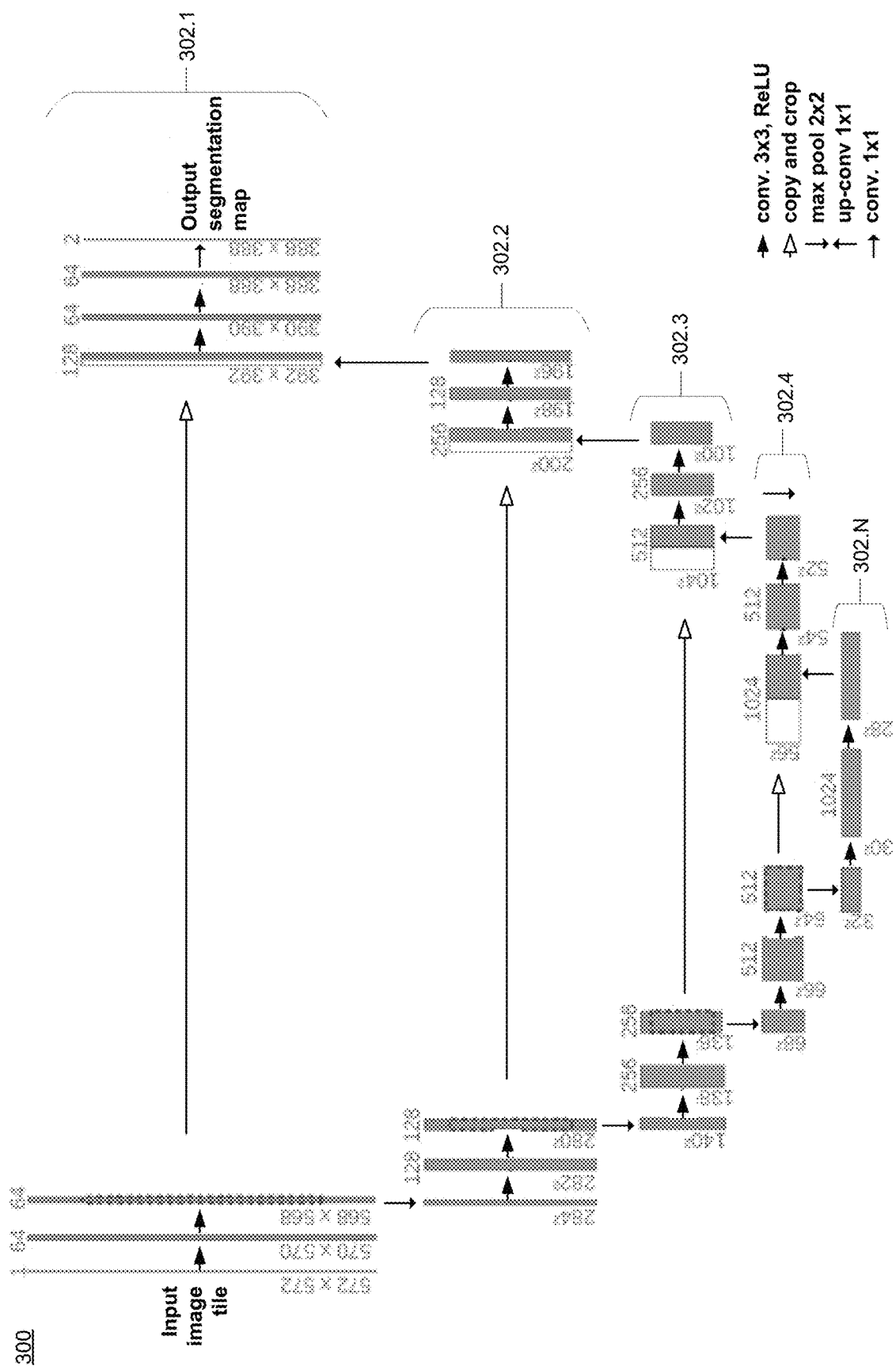
FIG. 3 is a graphical illustration of an example image de-noising architecture based on U-NET, in accordance with an aspect of the disclosure.

FIG. 3 is a graphical illustration of an example image de-noising architecture based on U-NET, in accordance with an aspect of the disclosure. The U-NET architecture is a convolutional neural network that was developed for biomedical image segmentation at the Computer Science Department of the University of Freiburg, Germany. The network is based on the fully convolutional network, and its architecture was modified and extended to work with fewer training images and to yield more precise segmentations.

As shown in FIG. 3, the network 300 implements a U-NET encoder-decoder network architecture that utilizes a contracting path to detect, and an expanding path to localize, anatomical structures/features (see, e.g., reference [13]). The example U-Net architecture shown in FIG. 3 is by way of example and not limitation. For example, the example U-Net architecture shown in FIG. 3 may be modified to operate in accordance with a 3D U-Net architecture to further improve upon the de-noising results [15]. Thus, the architecture as shown and described with reference to FIG. 3 may be identified with one or more processors (or portions thereof), computer networks, hardware, and/or software components that form a fully convolutional neural network.

In various aspects, the example network 300 may include additional or alternative components not shown in FIG. 3 for purposes of brevity. For example, the example architecture may be generally divided into any suitable number N of layers 302, each being associated with any suitable number of functional blocks. The functional blocks within each of the layers 302 may, in turn, include one or more computing devices and/or components, networks, network interface devices, displays, storage media, etc., within the overall neural network or other suitable architecture in which the machine learning algorithms are implemented. In accordance with these aspects, one or more processors identified with one or more of the functional blocks within each of the layers 302.1-302.N may perform the machine learning algorithms by executing instructions stored on one or more suitable storage media (e.g., a non-transitory computer-readable storage medium such as a hard disk or other suitable computer-readable memory). In any event, the functional blocks within each of the layers 302.1-302.N may realize the reconstruction and/or de-noising functions of the aspects as described herein To provide an illustrative example of the overall operation of the reconstruction and/or de-noising aspects as described herein, the magnetic resonance scanner as discussed with reference to FIG. 1 may generate one or more control signals (or receive one or more control signals from other portions of the magnetic resonance scanner) that result in the acquisition of MRI data, which may include under-sampled datasets associate with a sample tissue, for example. These datasets may, once acquired, be stored in any suitable format and in any suitable type of storage medium. For instance, the MRI data may be stored as one or more data files in a memory location that is accessible by the network 300 as described herein.

Moreover, the one or more processors associated with the functional blocks 302.1-302.N may likewise generate one or more control signals in response to user input, in response to the execution of computer-readable instructions, and/or upon accessing or reading the acquired and stored MRI data. The control signals generated by the one or more processors may thus result in the network 300 performing (e.g., via processors associated with functional blocks) a training process by acquiring and/or simulating at least one fully-sampled (ground truth) and one under-sampled Wave-CAIPIRINHA dataset having suitable wave parameters, as further discussed below. The control signals may further cause the network 300 to generate reconstructed datasets using, for example, a standard Wave-CAIPI reconstruction, which may also be performed by accessing data and/or instructions stored in a suitable storage medium as one or more data files.

The network 300, and in particular one or more of the functional blocks 302.1-302.N may further utilize control signals to train the network 300 by using the (noisy) reconstructed datasets as an input and calculating filter weights that result in the output of the network 300 matching a difference image. The difference image may be matched as part of this training process in accordance with any suitable type of comparison threshold (e.g., 1%, 5%, 10%, etc.) depending upon the desired result and/or based upon acknowledged compromises between accuracy, processing resources, and time. Upon being trained in this manner, the network 300 may further, in response to one or more control signals, propagate the reconstructed datasets through the network to obtain and display one or more de-noised images. The one or more de-noised output images may likewise be stored as one or more data files in a memory location that may be accessed and subsequently viewed, when desired, by appropriate medical personnel. The various computing acts performed by the functional blocks 302.1-302.N may be in response to any combination of user input and/or control signals that are automatically generated in response to the occurrence of certain events, e.g., the completion of MRI data acquisition and/or storage of the MRI data.

In an aspect, each layer 302 of the network implements several convolutional filters with a small spatial extent, which is followed by a nonlinear activation function (ReLU), as shown in FIG. 3. As a result, an input image may be converted to a multi-channel feature map, which is propagated through the network along any suitable number (e.g., all) possible paths. With continued reference to FIG. 3, each layer 302 of the contracting path that terminates as a max-pooling operation, forwards only those voxels that have a high activation. This gradually reduces the resolution, while the number of feature channels increases. Aspects include repeating this same process along the expanding path, but with gradually increasing resolution until the output has the same dimensions as the initial input.

Aspects include performing a reconstruction for highly under-sampled MRI scans using two sequential steps. The first of these steps includes performing a standard Wave-CAIPIRINHA reconstruction of an under-sampled dataset (i.e., the "reconstruction" or "training" step), which is followed by a second step that includes de-noising of the images obtained from the reconstruction step (i.e., the "de-noising" or "validation" step). The de-noising step may be performed, for example, by applying a neural network (e.g., network 300) as further discussed herein.

Figure 4A:
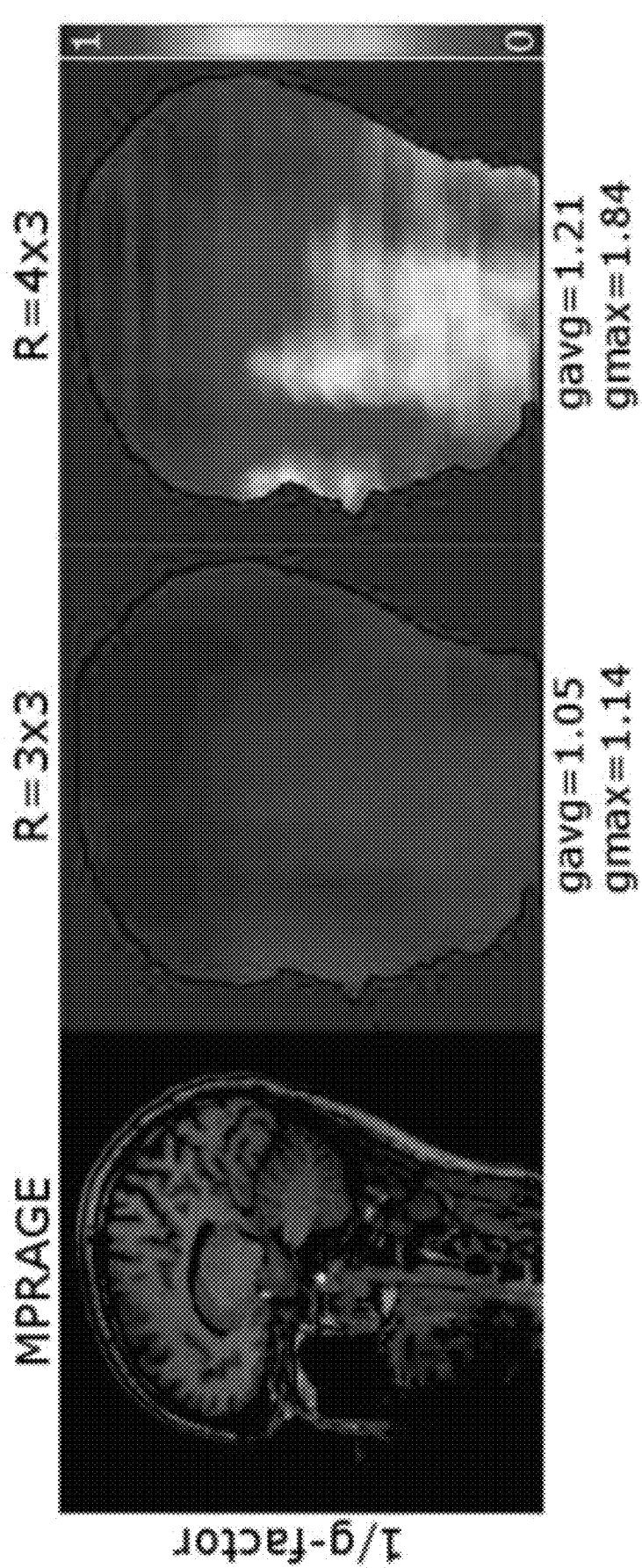
FIGS. 4A-4B are graphical illustrations of an example g-factor calculation for MPRAGE, SPACE T2w, and SPACE FLAIR using standard wave parameters, in accordance with an aspect of the disclosure.
Figure 4B:
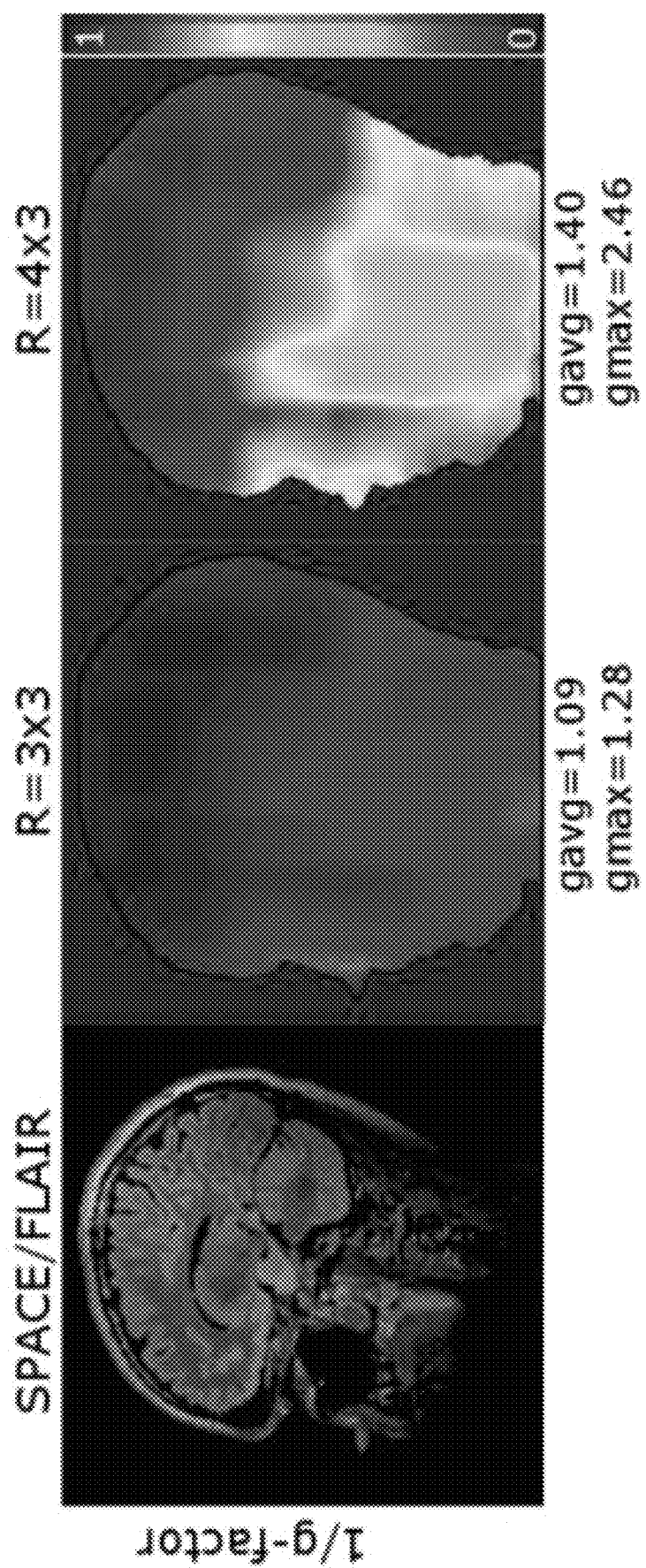

With regards to the reconstruction step, aspects include first training the network (e.g., network 300) by acquiring and/or simulating at least one fully-sampled (ground truth) and one under-sampled Wave-CAIPIRINHA dataset (e.g. R=3×3) having suitable wave parameters (e.g., a gradient amplitude and a number of sinusoidal cycles). The fully-sampled dataset and the under-sampled dataset may be referred to herein as "Wave data," a "Wave dataset," or simply "data" or "dataset"). In other words, the under-sampled dataset may form a part of an overall Wave dataset that is used for training the network. The under-sampled dataset is then reconstructed using, for example, a standard Wave-CAIPI reconstruction. If the Wave dataset was acquired (versus simulated), a gradient calibration method such as AutoPSF, for instance, may be utilized for the reconstruction (see, e.g., reference [14]). This results in a substantially artifact-free reconstruction. Moreover, with reference to FIGS. 4A-4B, which are graphical illustrations of an example g-factor calculation for MPRAGE, SPACE T2w, and SPACE FLAIR using standard wave parameters, it is shown that the subtraction of the ground truth and the accelerated scan (i.e., the difference image) indicates only white noise (g-factor~1).

Next, the reconstruction step includes feeding (e.g., providing as input from a memory, loading from memory, etc.) the under-sampled Wave reconstruction to the network 300. Filter weights are then trained such that the output matches the difference image. This procedure is referred to as "residual learning." The aspects therefore enable the network 300 to identify and filter noise from accelerated images while preserving anatomical structures. Aspects further include facilitating accelerated scans by retrospectively under-sampling fully-sampled scans. This prevents motion between acquisitions that are used as pairs in the network training, and does not necessitate image registration.

In the event that the Wave dataset is simulated as opposed to being acquired, aspects include synthetically creating Wave datasets by convolving a fully-sampled No-Wave scan with a desired Wave Point-Spread-Function (PSF), and applying retrospective under-sampling. This procedure may be particularly useful, for example, as the exact PSF is known using this technique, and thus errors from the gradient calibration do not affect the de-noising performance of the neural network [14].

Once the network 300 is sufficiently trained using acquired or simulated Wave data during the training step, aspects include de-noising the under-sampled wave dataset using the (now) trained network 300. For example, the under-sampled wave dataset may be input to the network 300 in accordance with the "input image tile" as shown and discussed herein with reference to FIG. 3. The noisy reconstruction is then propagated through the trained network 300 by providing the under-sampled Wave dataset as an input to produce, at the output of network 300 ("output segmentation map") the de-noised image.

Figure 5:
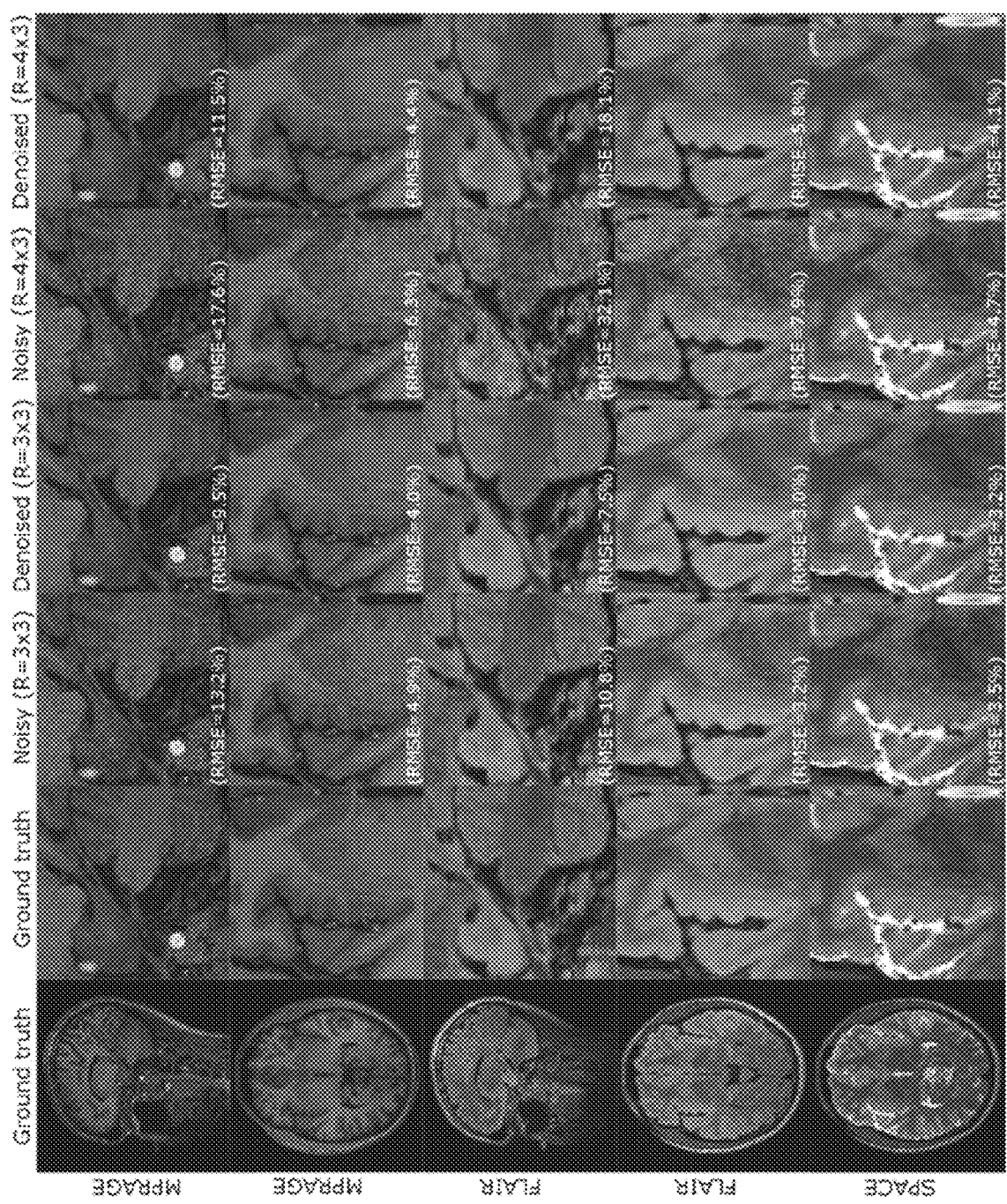
FIG. 5 is a graphical illustration of an example Zoom-in for Wave MPRAGE, SPACE T2w, and SPACE FLAIR after de-noising with UNET, in accordance with an aspect of the disclosure.

For ease of explanation with regards to this step, FIG. 5 is a graphical illustration of an example Zoom-in for Wave MPRAGE, SPACE T2w, and SPACE FLAIR after de-noising with UNET. As shown in FIG. 5, the output (e.g., pure noise) is subtracted from the input to obtain a de-noised image. As a result, noise is suppressed while most anatomical structures are preserved.

Figure 6:
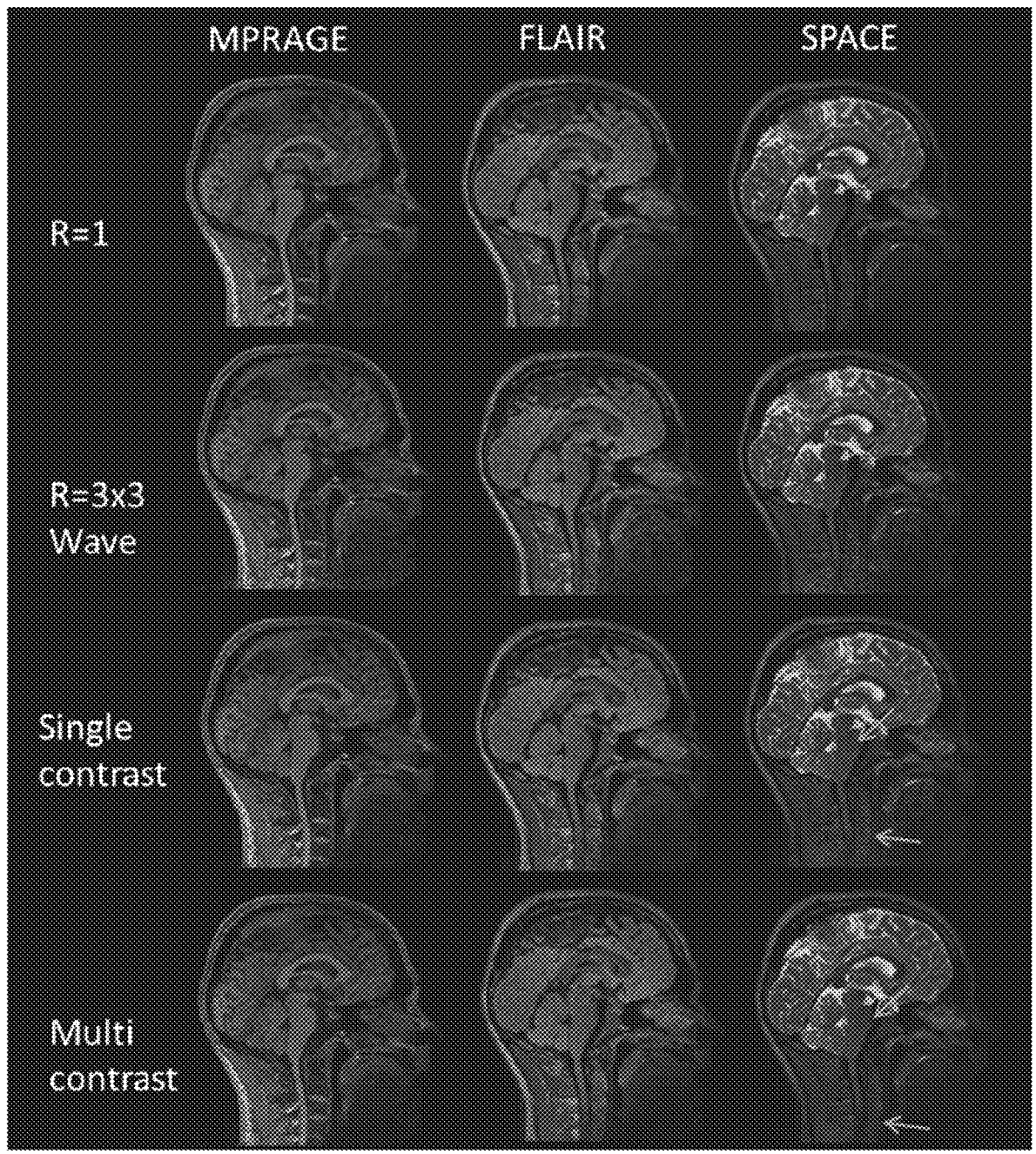
FIG. 6 is a graphical illustration of an example Wave MPRAGE, SPACE T2w, and SPACE FLAIR after application of multi-contrast UNET, in accordance with an aspect of the disclosure.

Aspects include further improving this result by, for example, simultaneously training/reconstructing multiple Wave images/contrasts. This may include, for instance, MPRAGE, SPACE T2w, and SPACE FLAIR, examples of which being illustrated in FIG. 6. This may be particularly useful, for example, for implementation in brain- or SPACE with/without fat saturation for orthopedic protocols. As shown in FIG. 6, the arrows indicate that de-noising performance is improved for low SNR regions in accordance with the de-noising aspects described herein.

The aspects described herein advantageously implement a neural network, which can be explicitly trained for wave scans. This yields a more natural image in comparison to the conventional techniques described herein. Moreover, and as noted above, the use of simultaneous training/reconstruction of multiple acquisitions may further improve upon the resulting image quality, which again may be particularly relevant with respect to the fast neuro protocol (e.g., Wave SWI, MPRAGE, SPACE T2w, and SPACE FLAIR). Fast orthopedic protocols (e.g., SPACE with/without fat saturation) may also benefit from a multi-contrast reconstruction.

Figure 7:
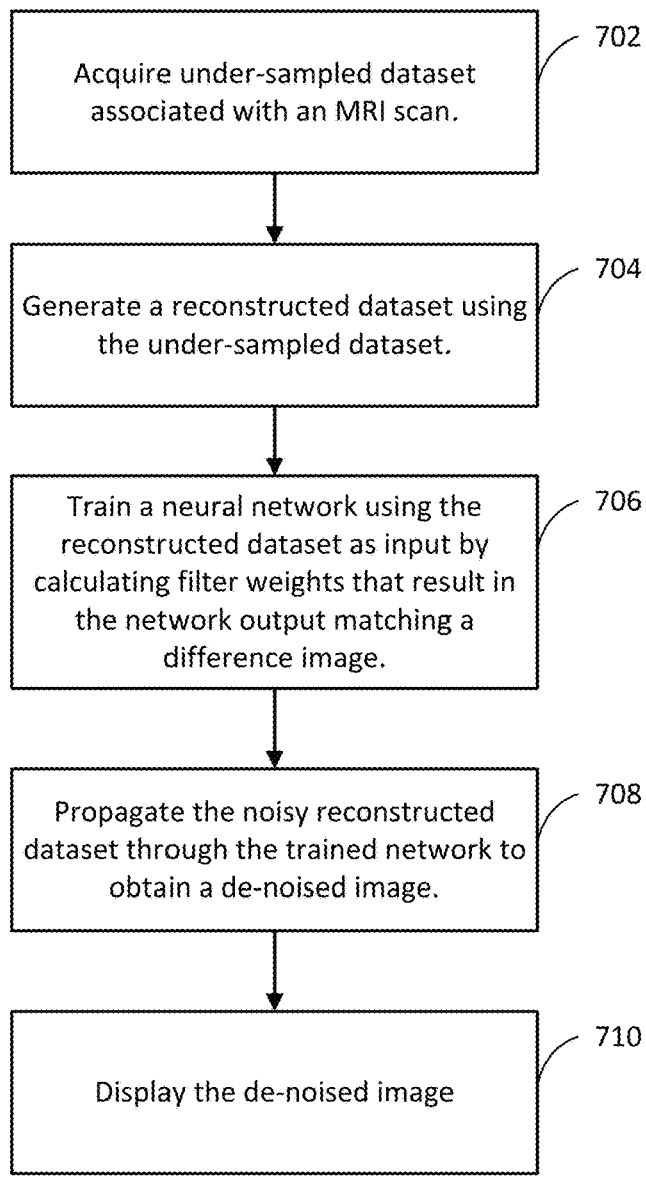
FIG. 7 is an example flow, in accordance with an aspect of the disclosure.

FIG. 7 is an example flow, in accordance with an aspect of the disclosure. With reference to FIG. 7, the flow 700 may be a computer-implemented method executed by and/or otherwise associated with one or more processors and/or storage devices. These processors and/or storage devices may be, for instance, associated with a convolutional neural network, such as the example network 300 as shown in FIG. 3, for example. In an aspect, flow 700 may be performed via one or more processors (e.g., those associated with the function blocks 302 as shown in FIG. 3) executing instructions stored on a suitable storage medium (e.g., a non-transitory computer-readable storage medium).

In an aspect, the flow 700 may describe an overall operation to de-noise highly accelerated Wave-CAIPIR-INHA scans using a neural network, as further discussed herein. Aspects may include alternate or additional steps that are not shown in FIG. 7 for purposes of brevity.

Flow 700 may begin when one or more processors acquire, receive, and/or access (block 702) an under-sampled dataset associated with an MRI scan. This may include, for example, accessing Wave data stored on an appropriate storage medium that includes at least one fully-sampled (ground truth) and one under-sampled Wave-CAIPIRINHA dataset (e.g. R=3×3) having suitable wave parameters, as discussed herein with respect to FIG. 3. This may also include accessing data as it is generated and/or prior to the data being stored on a storage medium.

Flow 700 may include one or more processors generating (block 704) a reconstructed dataset using the under-sampled dataset. This reconstruction may include, for example, utilizing a standard Wave-CAIPI reconstruction.

Flow 700 may include one or more processors training (block 706) a neural network using the reconstructed dataset as input by calculating filter weights that result in the network output matching a difference image. This may include, for example, training the network 300 as discussed herein with regards to filter weights and/or other metrics. These filter weights may correspond to any suitable number and/or type of filter(s) (e.g., a convolutional filters), which may be calculated by identifying a set of filter weights that cause the network 300 to output an image that matches a difference image. This difference image may be, for instance, the result of a subtraction of the ground truth and the accelerated scan, as discussed herein.

Flow 700 may include one or more processors propagating (block 708) the noisy reconstructed dataset through the trained network to obtain a de-noised image. This propagation may occur, for example, in accordance with the network 300 once trained (block 706) as discussed herein to filter the reconstructed dataset accordingly.

Flow 700 may include one or more processors displaying (block 710) the de-noised image. This may include, for example, displaying the de-noised images via any suitable type of display. This display may be associated with, for example, the magnetic resonance apparatus 5 as shown in FIG. 1, the network 300 as shown in FIG. 3, or another external and/or standalone display. For example, the displayed de-noised images may correspond to the de-noised images in accordance with Wave MPRAGE, SPACE T2w, SPACE FLAIR, etc., after application of UNET, as shown and discussed herein with reference to FIG. 5. As another example, the displayed de-noised images may correspond to the de-noised images in accordance with Wave MPRAGE, SPACE T2w, SPACE FLAIR, etc., after application of multi-contrast UNET, as shown and discussed herein with reference to FIG. 6.

Although modifications and changes may be suggested by those skilled in the art, it is the intention of the inventors to embody within the patent warranted hereon all changes and modifications as reasonably and properly come within the scope of their contribution to the art.

REFERENCES

The following references are cited throughout this disclosure as applicable to provide additional clarity, particularly with regards to terminology. These citations are made by way of example and ease of explanation and not by way of limitation.

Citations to the following references are made throughout the application using a matching bracketed number, e.g., [1].

[1] Breuer et al. Controlled aliasing in volumetric parallel imaging (2D CAIPIRINHA). Magn Reson Med. 2006 March; 55(3):549-56.
[2] Lustig et al. Sparse MRI: The application of compressed sensing for rapid MR imaging. Magn Reson Med. 2007 December; 58(6):1182-95.
[3] Bilgic et al. Wave-CAIPI for highly accelerated 3D imaging. Magn Reson Med. 2015 June; 73(6):2152-62.
[4] Polak et al. Wave-CAIPI for highly accelerated MP-RAGE imaging. Magn Reson Med. 2017 Feb. 20. doi: 10.1002/mrm.26649.
[5] Polak et al. Highly-accelerated brain MRI protocol using optimized Wave-CAIPI encoding. Joint Annual Meeting ISMRM-ESMRMB 2018, Paris, France. Accepted abstract.
[6] Lin et al. Parallel Imaging Reconstruction Using Automatic Regularization. Magn Reson Med. 2004 March; 51(3):559-67.
[7] Zhang et al. Denoising MR Images Using Non-Local Means Filter with Combined Patch and Pixel Similarity. PLoS ONE 9(6): e100240.https://doi.org/10.1371/journal.pone.0100240.
[8] Tomasi et al. Bilateral Filtering for Gray and Color Images. In: Proceedings of the Sixth International Conference on Computer Vision (ICCV '98). IEEE Computer Society, Washington D.C.
[9] Kannengiesser et al. Universal Iterative denoising of complex-valued volumetric MR image data using supplementary information. ISMRM 2016, Abstract #1779.
[10] Hammernik et al. Learning a variational network for reconstruction of accelerated MRI data. Magn. Reson. Med. doi:10.1002/mrm.26977.
[11] Zhu et al. Image reconstruction by domain transform manifold learning. arXiv:1704.08841.
[12] Gong et al. Improving the PI+CS Reconstruction for Highly Undersampled Multi-contrast MRI using Local Deep Network. ISMRM 2017, Abstract #5663.
[13] Ronneberger et al. U-Net: Convolutional Networks for Biomedical Image Segmentation. Medical Image Computing and Computer-Assisted Intervention (MICCAI). 2015; 935:1234-1241.
[14] Cauley et al. Autocalibrated wave-CAIPI reconstruction; Joint optimization of k-space trajectory and parallel imaging reconstruction. Magn Reson Med. 2016 Oct. 21. doi: 10.1002/mrm.26499.

[15] Cicek et al. Computer Vision and Pattern Recognition. arXiv:1606.06650.

What is claimed is:

1. A method, comprising:
   accessing, via one or more processors, an under-sampled dataset included in a Wave dataset, the under-sampled dataset being associated with a magnetic resonance imaging (MRI) scan, the Wave dataset corresponding to two added oscillating wave gradients thereby yielding a Wave dataset having a corkscrew trajectory in k-space;
   generating, via the one or more processors, a reconstructed dataset from the under-sampled dataset;
   training, via the one or more processors, a convolutional neural network by calculating filter weights that result in the convolutional neural network providing an output image that substantially matches a difference image;
   propagating, via the one or more processors, the reconstructed dataset through the trained convolutional neural network to generate one or more de-noised output images; and
   displaying, via the one or more processors, the one or more de-noised output images.

2. The method of claim 1, wherein the under-sampled dataset includes a Wave-controlled aliasing in volumetric parallel imaging (CAIPIRINHA) dataset.

3. The method of claim 2, wherein the Wave dataset further includes at least one fully-sampled dataset that is equivalent to a ground truth.

4. The method of claim 3, wherein the difference image is a result of a subtraction of the ground truth and an accelerated MRI scan that produces the under-sampled dataset.

5. The method of claim 1, wherein the act of generating the reconstructed under-sampled dataset includes the use of a Wave-controlled aliasing in parallel imaging (CAIPI) reconstruction.

6. The method of claim 5, wherein the act of generating the reconstructed under-sampled dataset includes the use of a gradient calibration.

7. The method of claim 1, further comprising:
   simulating, via the one or more processors, at least a portion of the Wave dataset by convolving a fully-sampled No-Wave scan with a Wave Point-Spread-Function (PSF) and applying retrospective under-sampling.

8. The method of claim 4, wherein the difference image resulting from the subtraction of the ground truth and the accelerated MRI scan yields only white noise.

9. The method of claim 4, wherein the accelerated scans include the use of retrospectively under-sampling the at least one fully-sampled scan without the use of image registration.

10. The method of claim 5, wherein the act of propagating the reconstructed dataset through the trained convolutional neural network to generate one or more de-noised output images is part of a residual learning procedure.

11. A convolutional neural network, comprising:
    a storage medium configured to store an under-sampled dataset included in a Wave dataset, the under-sampled dataset being associated with a magnetic resonance imaging (MRI) scan, the Wave dataset corresponding to two added oscillating wave gradients thereby yielding a Wave dataset having a corkscrew trajectory in k-space; and
    one or more processors configured to:
       generate a reconstructed dataset from the under-sampled dataset;
       train a convolutional neural network by calculating filter weights that result in the convolutional neural network providing an output image that substantially matches a difference image;
       propagate the reconstructed dataset through the trained convolutional neural network to generate one or more de-noised output images; and
       display the one or more de-noised output images.

12. The convolutional neural network of claim 11, wherein the under-sampled dataset includes a Wave-controlled aliasing in volumetric parallel imaging (CAIPIRINHA) dataset.

13. The convolutional neural network of claim 12, wherein the Wave dataset further includes at least one fully-sampled dataset that is equivalent to a ground truth.

14. The convolutional neural network of 10, wherein the difference image is a result of a subtraction of the ground truth and an accelerated MRI scan that produces the under-sampled dataset.

15. The convolutional neural network of claim 11, wherein the one or more processors are further configured to generate the reconstructed under-sampled dataset using a Wave-controlled aliasing in parallel imaging (CAIPI) reconstruction.

16. The convolutional neural network of claim 15, wherein the one or more processors are further configured to generate the reconstructed under-sampled dataset using a gradient calibration.

17. The convolutional neural network of claim 11, wherein the one or more processors are further configured to simulate at least a portion of the Wave dataset by convolving a fully-sampled No-Wave scan with a Wave Point-Spread-Function (PSF) and applying retrospective under-sampling.

18. The convolutional neural network of claim 11, wherein the convolutional neural network is associated with a U-NET architecture.

19. A non-transitory computer-readable medium associated with a convolutional neural network, the non-transitory medium having instructions stored thereon that, when executed by one or more processors, cause the one or more processors to:
    access an under-sampled dataset included in a Wave dataset, the under-sampled dataset being associated with a magnetic resonance imaging (MRI) scan, the Wave dataset corresponding to two added oscillating wave gradients thereby yielding a Wave dataset having a corkscrew trajectory in k-space;
    generate a reconstructed dataset from the under-sampled dataset;
    train the convolutional neural network by calculating filter weights that result in the convolutional neural network providing an output image that substantially matches a difference image;
    propagate the reconstructed dataset through the trained convolutional neural network to generate one or more de-noised output images; and
    display the one or more de-noised output images.

20. The non-transitory computer-readable medium of claim 19, wherein:
    the under-sampled dataset includes a Wave-controlled aliasing in volumetric parallel imaging (CAIPIRINHA) dataset,
    the Wave dataset further includes at least one fully-sampled dataset that is equivalent to a ground truth, and the difference image is a result of a subtraction of the ground truth and an accelerated MRI scan that produces the under-sampled dataset.

21. The non-transitory computer-readable medium of claim 19, further storing instructions that, when executed by one or more processors, cause the one or more processors to generate the reconstructed under-sampled dataset using a Wave-controlled aliasing in parallel imaging (CAIPI) reconstruction.

22. The non-transitory computer-readable medium of claim 21, further storing instructions that, when executed by one or more processors, cause the one or more processors to generate the reconstructed under-sampled dataset using a gradient calibration.

23. The non-transitory computer-readable medium of claim 19, further storing instructions that, when executed by one or more processors, cause the one or more processors to simulate at least a portion of the Wave dataset by convolving a fully-sampled No-Wave scan with a Wave Point-Spread-Function (PSF) and applying retrospective under-sampling.

* * * * *